(12) United States Patent
Jagt (10) Patent No.: US 8,547,010 B2
(45) Date of Patent: Oct. 1, 2013

(54) COLOR ADJUSTING ARRANGEMENT

(75) Inventor: Hekdrik J. B. Jagt, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 101 days.

(21) Appl. No.: 13/256,449

(22) PCT Filed: Mar. 15, 2010

(86) PCT No.: PCT/IB2010/051097
§ 371 (c)(1),
(2), (4) Date: Sep. 14, 2011

(87) PCT Pub. No.: WO2010/106478
PCT Pub. Date: Sep. 23, 2010

(65) Prior Publication Data
US 2012/0001204 A1    Jan. 5, 2012

(30) Foreign Application Priority Data
Mar. 19, 2009  (EP) ..................... 09155610

(51) Int. Cl.
*H01L 33/50*    (2010.01)
*G02F 1/35*    (2006.01)

(52) U.S. Cl.
USPC ............. 313/501; 313/500; 313/507; 445/24; 445/25; 257/E33.06

(58) Field of Classification Search
CPC ........ H01L 33/44; F21K 9/00; G02B 27/1046
USPC ................................. 313/498–512
See application file for complete search history.

(56) References Cited

U.S. PATENT DOCUMENTS

| | | | |
|---|---|---|---|
| 5,813,752 A | 9/1998 | Singer et al. | |
| 6,791,259 B1 | 9/2004 | Stokes et al. | |
| 8,058,088 B2 * | 11/2011 | Cannon et al. | 438/48 |
| 2006/0091779 A1 | 5/2006 | Takeda et al. | |
| 2008/0079015 A1 | 4/2008 | Krummacher | |
| 2008/0117500 A1 * | 5/2008 | Narendran et al. | 359/326 |
| 2008/0203414 A1 * | 8/2008 | Yen et al. | 257/98 |
| 2009/0057699 A1 | 3/2009 | Basin et al. | |

FOREIGN PATENT DOCUMENTS

| | | |
|---|---|---|
| WO | 2008040283 A1 | 4/2008 |
| WO | 2008044171 A3 | 4/2008 |

* cited by examiner

*Primary Examiner* — Tracie Y Green (57) ABSTRACT

Disclosed is a color adjusting arrangement comprising: i) a first wavelength converting material arranged to receive ambient light and capable of converting ambient light of a first wavelength range into light of a second wavelength range, and/or reflecting ambient light of said second wavelength range, said second wavelength range being part of the visible light spectrum; and ii) a complementary wavelength converting material arranged to receive ambient light and capable of converting part of said ambient light into light of a complementary wavelength range, which is complementary to said second wavelength range, and arranged to allow mixing of light of said second wavelength range and said complementary wavelength range; such that light of said second wavelength range that is emitted and/or reflected by said first wavelength converting material and light of said complementary wavelength range is mixed when leaving the color adjusting arrangement towards a viewing position, the light leaving the color adjusting arrangement thereby appearing less colored, i.e. having a color point substantially near the black body line. The invention thus allows an undesirable colored appearance of a semiconductor-phosphor based light source to be at least partly extinguished or neutralized.

20 Claims, 2 Drawing Sheets

COLOR ADJUSTING ARRANGEMENT

FIELD OF THE INVENTION

The invention relates to a color adjusting arrangement comprising a first wavelength converting material and a complementary wavelength converting material.

BACKGROUND OF THE INVENTION

Light-emitting diode (LED) based illumination devices are increasingly used for a wide variety of lighting and signaling applications. LEDs offer advantages over traditional light sources, such as incandescent and fluorescent lamps, including long lifetime, high lumen efficacy, low operating voltage and fast modulation of lumen output.

Efficient high-power LEDs are often based on blue light emitting InGaN materials. To produce an LED based illumination device having a desired color (e.g. white) output, a suitable wavelength converting material, commonly known as a phosphor, may be provided which converts part of the light emitted by the LED into light of longer wavelengths so as to generate a combination of light having the desired spectral characteristics. An example of a suitable wavelength converting material for use in a blue LED based device for emitting white light is a cerium-doped yttrium aluminum garnet (YAG:Ce).

A disadvantage of the LED-phosphor based illumination devices is that in the functional off-state of the device, the color of the phosphor may be clearly visible. For example, YAG:Ce has a distinct yellowish appearance. Since in many applications a colored appearance of a light source in the off-state is undesired, techniques have been developed to produce LED based illumination devices having a neutral, e.g. white or whitish, appearance in the off-state. One such technique is disclosed in WO 2008/044171, which describes a lighting device comprising an LED and a phosphor layer. The lighting device further comprises means for providing a residual current to the LED in the functional off-state. As a result of the residual current running through the LED in the functional off-state of the lighting device, the tiny amount of light produced by the LED outshines the reflected ambient light, and hence the LED will appear to have a neutral color to the human eye.

However, there is a need in the art for improved light emitting devices, which in the functional off-state have a white or neutral appearance.

SUMMARY OF THE INVENTION

It is an object of the present invention to overcome at least some of the problems of the prior art, and to provide a color adjusting arrangement which may reduce a colored appearance of a wavelength converting material of a light emitting device in the off-state.

In one aspect, the invention relates to a color adjusting arrangement comprising:

a first wavelength converting material arranged to receive ambient light, incident from a viewing position outside the color adjusting arrangement, and capable of converting ambient light of a first wavelength range into light of a second wavelength range and/or reflecting ambient light of said second wavelength range, said second wavelength range being part of the visible light spectrum; and a complementary wavelength converting material arranged to receive ambient light and capable of converting part of said ambient light into light of a complementary wavelength range, which is complementary to said second wavelength range, and arranged to allow mixing of light of said second wavelength range and said complementary wavelength range, such that light of said second wavelength range that is emitted and/or reflected by said first wavelength converting material is mixed with light of said complementary wavelength range when leaving the color adjusting arrangement towards said viewing position, the light leaving the color adjusting arrangement having a color point substantially near the black body line. Thus, thereby appearing less colored, i.e. preferably neutral, e.g. whitish or white. Hence, when exposed to ambient light, the color of the phosphor used for obtaining white light by conversion of blue light emitted by a LED is not visible, or at least less visible, from the outside. The color adjusting arrangement is applicable to various phosphor based LEDs containing a blue phosphor, orange/amber phosphor, red phosphor, or green phosphor, by adding in each case a suitable complementary color (wavelength range).

With the color adjusting arrangement according to the present invention, no additional scattering material is required for the purpose of giving a less colored off-state appearance, which may result in an improved efficiency, since the amount of light lost due to scattering in the on-state may be reduced.

For example, the complementary wavelength converting material may be capable of converting ambient light in the wavelength range up to 420 nm, such as from 250 to 420 nm, for example from 350 to 420 nm, into light of said complementary wavelength range. Advantageously, UV or deep blue light may be converted to any visible wavelength using the appropriate wavelength converting material. Another advantage of using an UV absorbing complementary wavelength converting material is that it may provide protection of the first wavelength converting material and any other structures of the color adjusting arrangement, or any structures of an illumination device comprising the color adjusting arrangement, from UV light. Typically, the complementary wavelength range may be from 400 to 500 nm.

The first wavelength range may be from 300 to 520 nm, for example from 420 to 480 nm. Furthermore, the second wavelength range may be from 490 to 780 nm.

The color adjusting arrangement may comprise a first domain, such as a layer, comprising said first wavelength converting material, and a complementary domain, such as a layer, comprising said complementary wavelength converting material. Thus, the first wavelength converting material and the complementary wavelength converting material may be spatially separated, which may reduce the risk of the first wavelength converting material re-absorbing light of the complementary wavelength range emitted by the complementary wavelength converting material. Such re-absorption might reduce the color adjusting effect of the complementary wavelength converting material. Hence, by arranging the first wavelength converting material and the complementary wavelength converting material in separate domains, a smaller amount of complementary wavelength converting material may be used to achieve a color adjusting effect.

The complementary domain described above may further comprise scattering elements, which may improve the color adjusting effect of the color adjusting arrangement. For example, a scattering domain, e.g. in the form of a scattering layer, may be arranged in the path of incident ambient light extending via the complementary domain to the first domain, such that incident ambient light first reaches the complementary domain, subsequently reaches the scattering domain, and lastly reaches the first domain. Since some scattering materials, e.g. TiO$_2$, may compete with the complementary wavelength converting material for light absorption, it may be preferable to arrange a complementary wavelength converting domain such that the ambient light enters this domain before entering the scattering material. In this way the complementary wavelength converting material may be utilized more effectively.

In embodiments of the invention, the color adjusting arrangement may comprise a plurality of scattering domains having different scattering properties. Thus, the scatter contribution to the color adjusting effect may be tuned and the light emitted by the wavelength converting material may be effectively recycled.

The color adjusting arrangement may further comprise a dichroic reflector, which may be arranged in the path of incident ambient light extending via said complementary domain to said first domain, such that incident ambient light first reaches said complementary domain, subsequently reaches said dichroic reflector, and lastly reaches said first domain. The presence of a dichroic reflector may increase the amount of light converted by the complementary wavelength converting material. Also, by protecting the first wavelength converting material and, when present, the scattering layer from ambient UV light, a dichroic reflector may avoid or reduce UV induced damage and/or improve the performance of the first wavelength converting material and/or a scattering layer.

The complementary wavelength converting material may comprise an inorganic phosphor material, preferably a BAM phosphor. The complementary wavelength converting material may be a particulate material. By suitably choosing the particle size, the contribution of the complementary wavelength converting material to light scattering, when dispersed in a binder or carrier material, may be adapted.

Alternatively, the complementary wavelength converting material may comprise an organic material. Commercial fluorescent materials are readily available. Organic molecules may be dissolved in a carrier material and therefore do not contribute to light scattering, which may improve light extraction.

In another aspect, the invention relates to an illumination device comprising a semiconductor light emitting element, such as an LED or a solid state laser diode, for emitting light of said first wavelength range and a color adjusting arrangement as described herein.

Typically, the first wavelength converting material may be arranged in a path of light from said semiconductor light emitting element towards said complementary wavelength converting material, such that, in the on-state of the illumination device, light emitted by the semiconductor light emitting element reaches the first wavelength converting material before reaching the complementary wavelength converting material. By thus arranging the complementary wavelength converting material "on top" or "outside" of the first wavelength converting material, the complementary wavelength converting material does not obstruct the passage of light emitted from the LED and intended to be received by the first wavelength converting material. Thus, effective use of the first wavelength converting layer in the on-state is achieved. Also, if the complementary wavelength converting material is UV absorbing, it may provide protection of the semiconductor light emitting elements, as well as the first wavelength converting material, against UV radiation. Furthermore, when the respective absorption wavelength ranges of the first and the complementary wavelength converting materials at least partially overlap (i.e., the complementary wavelength converting material absorption range at least partially overlapping said first wavelength range), arranging the complementary wavelength converting material outside the first wavelength converting material may further reduce undesired off-state emission and/or reflection of color by the first wavelength converting material. For example, various phosphor materials may have absorption bands in the blue part of the spectrum but also in the UV part of the spectrum. The complementary wavelength converting material absorbing the ambient UV will prevent UV excitation of the first wavelength converting material and subsequent re-emission of the undesired color.

In embodiments of the invention, said semiconductor light emitting element and at least one of said first wavelength converting material and said complementary wavelength converting material are arranged mutually spaced apart. For example, both the first wavelength converting material and the complementary wavelength converting material may be spaced apart from the semiconductor light emitting element, or only the complementary wavelength converting material and the semiconductor light emitting element may be mutually spaced apart. This remote configuration facilitates recycling of light that is emitted by the phosphor back towards the semiconductor light emitting element using highly reflective surfaces adjacent to the light emitting element.

Typically, the illumination device may be an illumination device which in its on-state emits white light, i.e. light having a color point substantially near the black body line.

In embodiments of the invention the illumination device may further comprise an additional light source, preferably an additional semiconductor light emitting element such as an LED, providing, in the off-state of said semiconductor light emitting element for emitting light of a first wavelength range, light of the wavelength range of from 250 to 420 nm to the complementary wavelength converting material for conversion into light of the complementary wavelength range. Thus, even if the ambient light should be deficient in the absorption wavelength range of the complementary wavelength converting material, but not in said first wavelength range, an acceptable color adjusting effect may still be obtained.

It is noted that the invention relates to all possible combinations of features recited in the claims.

BRIEF DESCRIPTION OF THE DRAWINGS

These and other aspects of the present invention will now be described in more detail, with reference to the appended drawings showing currently preferred embodiments of the invention.

DETAILED DESCRIPTION

Advantageous embodiments of the invention will now be described with reference to the appended drawings. As illustrated in the figures, the sizes of layers and regions are exaggerated for illustrative purposes and, thus, are provided to illustrate the general structures of embodiments of the present invention.

Figure 1:
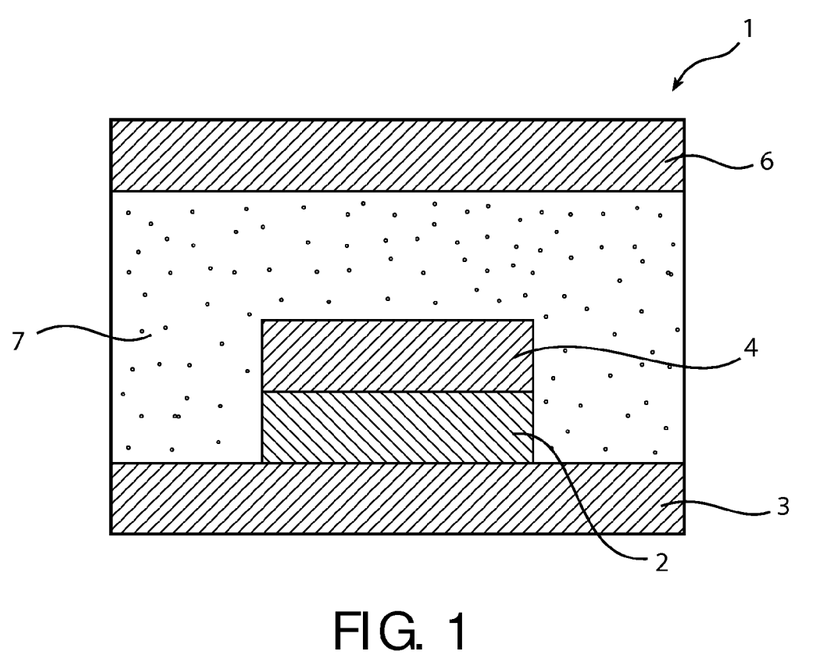
FIG. 1 illustrates an illumination device comprising a color adjusting arrangement according to embodiments of the invention.

An illumination device comprising a color adjusting arrangement according to embodiments of the invention is illustrated in FIG. 1. The illumination device 1 comprises a semiconductor light source in the form of an LED 2 arranged on a substrate 3 and connected to an electric power supply by conventional means (not shown). A first wavelength converting material 4 is arranged to receive at least part of the light of said first wavelength range emitted by the LED 2 and to emit wavelength converted light of a second (different) wavelength range. Furthermore, a complementary wavelength converting material 6 is arranged in the path of incident ambient light to the first wavelength converting material 4. Finally, a scattering domain 7 is provided between the first wavelength converting material and the complementary wavelength converting material and around the LED 2.

The LED 2 may be any type of conventional LED, such as an inorganic LED comprising an p-n-junction for generation of light. However, in embodiments of the invention the semiconductor light source may be any other solid state source, such as a solid state laser. The LED 2 is adapted to, in operation, emit light of at least a first wavelength range. Typically, the semiconductor light emitting element may be adapted to emit light of a wavelength in the range of 300 to 520 nm, such as 350 to 500 nm, for example 400 to 500 nm, and in particular 420 to 480 nm. Examples of such semiconductor light emitting elements include LEDs based on InGaN, GaN and AlInGaN or ZnSe.

The LED 2 may be a flip chip thin film LED package. Alternatively, it may also be a flip chip device with the growth substrate (typically sapphire) still present on top of the LED (on the n-side), in which case a wavelength converting material may be deposited onto said growth substrate. Furthermore, a LED using a wire-bond connection for the top electrode may be used, in which case any wavelength converting material applied onto the LED 2 may be suitably adapted to allow passage of the bond wire.

In order to emit light of a desired color, such as white light, the illumination device of FIG. 1 comprises a first wavelength converting material 4 arranged to receive at least part of the light of said first wavelength range emitted by the LED 2, and to emit wavelength converted light in a light exit direction of the illumination device. The wavelength converting material 4 absorbs at least some of the received light and subsequently re-emits light of a second (different) wavelength range. The LED 2 and the wavelength converting material 4 are typically chosen such that the resulting mix of light of said first and second wavelength ranges which exits the illumination device 1 is perceived as having a desired color, such as white. Typically, for achieving white light, when said first wavelength range emitted by the LED is from 420 to 480 nm, the second wavelength range may be from 470 to 800 nm, for example 490 to 780 nm (emission range for YAG:Ce), or 470 to 710 nm (emission range for LuAG:Ce).

Examples of suitable wavelength converting materials include inorganic wavelength converting materials, also known as phosphors. An example of a first wavelength converting material that may be used in embodiments of the invention, typically in combination with a blue LED, is yttrium aluminum garnet doped with cerium ($Y_3Al_5O_{12}$:$Ce^{3+}$, also referred to as YAG:Ce). As an alternative to cerium, another suitable element, such as terbium (Tb) or europium (Eu) may be used as a dopant. Furthermore, part of the aluminum may be substituted with gadelinium (Gd) or gallium (Ga), such as in $Y_3(Al,Gd)_5O_{12}$:$Ce^{3+}$, in which more Gd results in a red shift of the yellow emission. By incomplete conversion of the incident light, typically blue light, the mixed light may be white, and thus substitution with Gd may provide a warmer white emission. Other examples of phosphor material that may be used for the first wavelength converting material according to embodiments of the invention include lutetium aluminum garnet LuAG:Ce, with formula $Lu_3Al_5O_{12}$:$Ce^{3+}$, which has a greenish emission in which similar dopant or Al substitutions may be realized. The greenish emission may be mixed with blue by partial conversion to a greenish white.

Generally suitable luminescent materials may include aluminum garnet phosphors with the general formula $(Lu_{1-x-y-a-b}Y_xGd_y)_3(Al_{1-z}Ga_z)_5O_{12}$:$Ce_aPr_b$, wherein $0<x<1$, $0<y<1$, $0<z\le0.1$, $0<a\le0.2$ and $0<b\le0.1$.

Furthermore, other phosphor materials that are excited by the light source may be used, for example oxynitride phosphors such as europium (Eu) doped $SrSi_2O_2N_2$ or $BaSi_2O_2N_2$, or $CaSi_2O_2N_2$ or nitride phosphors such as europium doped barium strontium silicium nitrides $(Ba,Sr)_2Si_5N_8$ or europium doped calcium aluminum silicium nitrides.

Generally, suitable luminescent materials may include $(Sr_{1-x-y}Ba_xCa_y)_{2-z}Si_{5-a}Al_aN_{8-a}O_a$:$Eu_z^{2+}$ wherein $0\le a<5$, $0<x\le1$, $0\le y\le1$ and $0<z\le1$, such as $Sr_2Si_5N_8$:$Eu^{2+}$ which emits light in the red range.

Other suitable luminescent materials may include materials of the general formula $(Sr_{1-a-b}Ca_bBa_c)Si_xN_yO_z$:$Eu_a^{2+}$ (a=0.002-0.2, b=0.0-0.25, c=0.0-0.25, x=1.5-2.5, y=1.5-2.5, z=1.5-2.5).

In an alternative embodiment, instead of a semiconductor light emitting element emitting light of said first wavelength, the illumination device may comprise a semiconductor light emitting element emitting light of a wavelength range shorter than said first wavelength range, and an additional wavelength converting material arranged to receive light emitted by the semiconductor light emitting element and adapted to convert this light into light of said first wavelength range. Thus, the light of the first wavelength range received by the first wavelength converting material described above may originate from said additional wavelength converting material. For example, instead of a blue light emitting LED, a UV emitting LED in combination with a UV absorbing and blue light emitting wavelength converting material may be used.

The wavelength converting material 4 is arranged to receive at least part of the light emitted by the LED 2. In the embodiment shown in FIG. 1, the wavelength converting material 4 is applied on top of the LED 2. For example, the wavelength converting material 4 may be sintered to a ceramic component and formed into a suitable shape, e.g. having approximately the same surface area as the LED 2, and attached to the LED by means of a bonding layer (not shown). Alternatively, the wavelength converting material may be dispersed in a binder material, for example epoxy or silicone resin, and deposited on top of the LED using e.g. electrophoretic deposition.

Alternatively, the first wavelength converting material may be arranged at a distance from the LED, forming a so-called remote phosphor arrangement, which will be described in detail below with reference to FIG. 3. In such an arrangement, the first wavelength converting material may receive light of said first wavelength range emitted by multiple LED sources.

Examples of binder materials suitable for a wavelength converting material that is applied on top of the LED include silicone resins, polyimides, silsesquioxanes or sol-gel type materials that form a silicate, a methyl silicate or phenylsilicate network. Examples of binder material suitable for use with a remote phosphor include polyacrylates/acrylics (e.g. PMMA), polycarbonates, polyamides, polyesters, polyolefines (e.g. polyethylene, polypropylene) and silicones.

The color appearance of the wavelength converting material 4 may result from i) the conversion of part of the ambient light, e.g. part of the blue component and/or part of the UV component of the ambient light, that is incident on the wavelength converting material 4 from a viewing position outside the illumination device 1, into light of an emission wavelength range of that wavelength converting material, ii) the selective reflection and/or backscattering of ambient light of the emission wavelength range by the wavelength converting material, and/or iii) a combination of conversion/reflection by the wavelength converting material and reflection the semiconductor light source or submount device (especially where the wavelength converting materials is in the form of a transparent or translucent ceramic). For example, YAG:Ce may convert ambient light of the wavelength range of from 400 to 520 nm into light of from 490 to 780 nm, and also partially reflect light of wavelengths in the whole range of 400 to 800 nm. As a result, the YAG:Ce material has a yellow appearance.

The present inventors have found that an additional wavelength converting material, which is capable of converting ambient light into light that is complementary to the light emitted and/or reflected by the first wavelength converting material, can be used in order to avoid, or neutralize, or at least reduce an undesired, visible color of the first wavelength converting material in the off-state of the illumination device. Accordingly, the embodiment of the invention illustrated in FIG. 1 comprises a color adjusting arrangement comprising a complementary wavelength converting material 6 arranged to convert ambient light into light of a complementary wavelength range which is complementary to the second wavelength range emitted by the first wavelength converting material 4. Hence, in the off-state of the illumination device 1, light of the second wavelength range is emitted and/or reflected by the first wavelength converting material 4 as described above, and light of the complementary wavelength range is emitted by the complementary wavelength converting material 6, such that the resulting combination of the total emitted and/or reflected light thereby reduces the colored appearance of the wavelength converting material. The result may thus be a white or whitish appearance, i.e. having a color point substantially near the black body line 10 (see FIG. 2). However, in some instances it might not be necessary to achieve a full white appearance, and thus a reduction in the colored appearance may be sufficient. Furthermore, it may be desirable to keep a slightly colored appearance for reasons of efficiency.

By "light" is meant UV and visible electromagnetic radiation.

By "ambient light" is meant the UV and visible radiation originating from the surroundings of the illumination device according to the present invention. Thus ambient light may originate both from natural and from artificial light sources.

Figure 2:
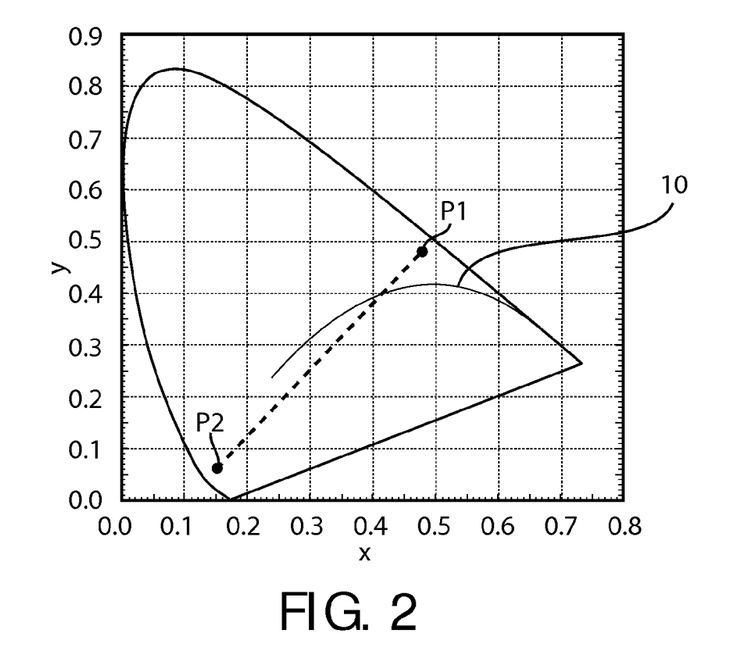
FIG. 2 shows the CIE 1931 x,y chromaticity space in which positions are marked representing light of said first wavelength range and light of said complementary wavelength range, respectively, according to embodiments of the invention.

By "complementary light" or "complementary wavelength (range)" is generally meant light of a color which, when mixed with in the proper proportion with light of said second wavelength range, produces a neutral color (white or whitish) having a color point substantially near the black body line 10.

To illustrate the concept of complementary light, FIG. 2 shows the CIE 1931 x,y chromaticity space in which positions P1 and P2 are marked representing the light emitted by a YAG:Ce material (example of a first wavelength converting material) (P1) and by a complementary wavelength converting material (P2), respectively. Depending on the ratio of the amount of light of the complementary wavelength range (here: blue light) to the amount of light of the second wavelength range (here: yellowish light), a mix of light represented by a position along the line between said positions is obtained.

It shall be noted that the principle of the color adjusting arrangement may also be used for achieving any desired color in the off-state of a phosphor containing illumination device, which in its on-state emits either white light or light of any particular color(s), by suitably choosing an additional wavelength converting material capable of converting ambient light into light of a wavelength range that provides the desirable color when mixed with the emitted/reflected color of the first wavelength converting material in the off-state. In such cases, the features of such an additional wavelength converting material may be the same as or corresponding to those described herein for the complementary wavelength converting material.

Preferably, the complementary wavelength converting material 6 is capable of converting UV or near UV light into light of longer wavelengths. For example, the complementary wavelength converting material may be capable of absorbing light of the wavelength range of 300 to 420 nm, for example about 350 to 380 nm, and re-emitting light in the wavelength range of from 400 to 750 nm, typically 400 to 500 nm.

Furthermore, the color reduction effect observed with the color adjusting arrangement will depend on the incident light distribution. For example, if the complementary wavelength converting material is adapted to convert only UV light into light of the complementary wavelength range and there is little or no UV light in the ambient incident light, a satisfactory color adjusting effect will not be achieved if the complementary layer is also transparent. However, if the complementary wavelength converting material is scattering, a satisfactory color adjusting effect may still be achieved.

Furthermore, the complementary wavelength converting material may be capable of transmitting light having wavelengths longer than said complementary wavelength range, such as converted light emitted by the first wavelength converting material 4.

The complementary wavelength converting material may be present in an amount which is adapted such that an intensity of light of said complementary wavelength range leaving the device matches an intensity of light of said secondary wavelength range leaving the device, such that the resulting combination of light of said secondary and complementary wavelength ranges leaving the color adjusting arrangement has a desirably reduced colored appearance, for example substantially white or whitish, i.e. having a color point on or near the black body line 10. The intensity of light of the complementary wavelength range leaving the device may be approximately the same as the intensity of light of the second wavelength range leaving the device. By thus adapting the amount of complementary wavelength converting material to the capability of the first wavelength converting material to convert ambient light into said second wavelength range and/or reflect ambient light of the second wavelength range in the light exit direction, a resulting combination of light is obtained in which neither the intensity of the light of the secondary wavelength range nor the intensity the complementary wavelength range exiting the illumination device is dominant, such that neither the color of the first wavelength converting material nor the color of the complementary wavelength converting material may be clearly distinguished. The amount of wavelength converting material may be adapted by adjusting the layer thickness, concentration of the particulate or concentration of molecularly dissolved converting material or concentrations of the dopant.

The complementary wavelength converting material 6 is arranged to receive ambient light to emit wavelength converted light in a light exit direction, such that the light exiting the illumination device 1 in the off-state is a mixture of light of said second wavelength range and said complementary wavelength range. Thus, the function of the complementary wavelength converting material may be dependent on the ambient lighting conditions.

In embodiments of the invention, the illumination device may comprise a first domain, e.g. a layer, comprising said first wavelength converting material, and a complementary domain, e.g. a layer, comprising said complementary wavelength converting material. The first wavelength converting material and the complementary wavelength converting material may thus be comprised in separate domains. Spatial separation of the complementary wavelength converting material from the first wavelength converting material may reduce the risk of the first wavelength converting material re-absorbing and converting light emitted by the complementary wavelength converting material in embodiments where the first wavelength range and the complementary wavelength range overlap. Hence, advantageously, arranging the first wavelength converting material and the complementary wavelength converting material in separate domains may avoid or at least reduce any undesired re-absorption of the complementary light, and thus the effect of the complementary wavelength converting material may be improved.

In embodiments of the invention, the first wavelength converting material 4 may be arranged in the path of light from the LED 2 towards the complementary wavelength converting material. Thus, in the on-state of the illumination device 1, which may be a white illumination device, light of said first wavelength range generated by the LED 2 typically reaches the first wavelength converting material 4, where a part of said light is absorbed and subsequently re-emitted as light of said second wavelength range (i.e., converted), and part of said light is transmitted. However, in embodiments of the invention, substantially all of said light of the first wavelength range may be converted by the wavelength converting material 4. Hence, the light exiting the first wavelength converting material 4 is a mixture of light of said first wavelength range and light of said second wavelength range. The mixture of light exiting the first wavelength converting material 4 subsequently reaches the complementary wavelength converting material 6, through which it is transmitted and optionally scattered. The mixture of light of said first and second wavelength ranges may then exit the illumination device 1.

For example, the complementary wavelength converting material 6 may be arranged in a light exit window of the illumination device 1.

The complementary wavelength converting material of the invention may be an inorganic wavelength converting material, such as a phosphor, or an organic fluorescent material, such as an organic based optical brighteners (also referred to as fluorescent whitening agents, FWA).

An example of a suitable inorganic complementary wavelength converting material is an europium doped BAM type phosohor, such as $BaMgAl_{10}O_{17}$:Eu. Such a BAM phosphor is particularly advantageous for use in combination with a YAG:Ce material as the first wavelength converting material, since it may convert UV or near UV light into light in a wavelength range of 400 to 520 nm, typically having a peak emission at about 450 nm.

Examples of suitable organic fluorescent materials include 4,4'-bis(benzoxazol-2-yl)stilbene (commercial name UVITEX OB-ONE); 2-thiophenediylbis(5-tert-butyl-1,3-benzoxazole) (commercial name UVITEX OB) and hexasodium-2,2'-[vinylenebis[3-sulfonato-4,1-phenylene)imino[6-(diethylamino)-1,3,5-triazine-4,2-diyl]imino]]bis(benzene-1,4-disulphonate), and mixtures thereof, in particular for use in combination with a YAG:Ce material as the first wavelength converting material. Furthermore, organic dye materials such as xanthenes dyes, oxazine dyes, cyanine dyes, rhodamine, coumarin, polyparaphenylene vinylene, tris-(8-hydroxyquinoline)aluminum (Alq3) or 4-dicyanomethylene-2-methyl-6-(p-dimethylaminostyrene)-4H-pyran (DCM) could also be used.

In embodiments of the invention, the complementary wavelength converting material may provide a light scattering effect on emitted and/or transmitted light. Typically, when the wavelength converting material is a particulate having an average particle size in the range of 100 nm to 15 µm, the complementary wavelength converting material may contribute to scattering of light. Scattering of light may improve the uniformity of light leaving the illumination device 1 in the on-state, and may contribute to reducing the colored appearance of the first wavelength converting material in the off-state of the illumination device. Generally, a particulate complementary wavelength converting material having an average particle size of less than 100 nm will not significantly contribute to scattering of light. The particulate may also be dispersed in a binder of similar refractive index in which the particulate will not substantially scatter.

Alternatively, the complementary wavelength converting material may be a macroscopic solid, e.g. a sintered ceramic component. In such a component pores may be included to provide a scattering function, and/or additional scattering particles may be included.

The complementary wavelength converting material 6 may be a particulate material, optionally dispersed in a carrier or binder material. The average particle size (diameter) of the complementary wavelength converting material may then range from 10 nm to about 15 µm. In embodiments of the invention, an average particle size in the range of 1 to 15 µm may be preferred. However in other embodiments of the invention, particles having a diameter of less than 100 nm, which generally do not contribute to scattering of the light, may be preferred. By suitably choosing the particle size, the contribution of the complementary wavelength converting material to light scattering, when dispersed in a binder or carrier material, may be adapted.

Alternatively, the complementary wavelength converting material may be soluble in a carrier or binder material, such as those binder materials described above with reference to the first wavelength converting material. When the complementary wavelength converting material is dissolved in the binder material it will generally not contribute to scattering of light.

In the off-state of the illumination device 1, no light is generated by the LED 2. Ambient light incident on the illumination device 1 may reach the complementary wavelength converting material 6, and part of the incident ambient light, for example near UV light, may be absorbed and subsequently re-emitted as light of said complementary wavelength range, whereas part of the ambient light may be transmitted, and optionally scattered, by the complementary wavelength converting material 6. At least part of the light emitted by the complementary wavelength converting material 6 may exit the illumination device 1. Furthermore, part of the ambient light transmitted by the complementary wavelength converting material 6 may reach the first wavelength converting material 4 where a part of this light, typically light of said first wavelength range, is absorbed and re-emitted as light of said second wavelength range whereas the incident light within the second wavelength range is at least partially reflected. At least part of the light emitted by the first wavelength converting material 4 may exit the illumination device 1. Thus the light exiting the illumination device 1 in the off-state may be a mixture of light of said first and complementary wavelength ranges.

The complementary wavelength converting material 6, optionally dispersed in a binder material as described above, may be arranged as a layer, which may be separate from a layer comprising the first wavelength converting material 4. When the first wavelength converting material 4 and the complementary wavelength converting material 6 are comprised in separate layers, it may be preferred that a layer comprising the first wavelength converting material is arranged in the path of light from the LED towards a layer comprising the complementary wavelength converting material. Said separate layers may be provided adjacent to each other, or they may be separated by a spacer layer, such as a transparent layer, e.g. a transparent adhesive, a scattering layer or an air gap.

Alternatively or additionally, in embodiments of the invention where a binder material such as a silicone resin comprising the first wavelength converting material dispersed therein is applied on top of the LED 2, the binder material may further comprise at least part of the complementary wavelength converting material.

In embodiments of the invention, the color adjusting arrangement may comprise a scattering domain in addition to the wavelength converting materials. As illustrated in FIG. 1, a scattering domain 7 may be provided on top of and at least partially around the LED 2 and the first wavelength converting material 4. A scattering domain provided in the line of sight from an observer to the first wavelength converting material may reduce the visibility of a color of the first wavelength converting material. A scattering domain may also improve the distribution of light. For example, a scattering material may be provided between the first wavelength converting material 4 and the complementary wavelength converting material 6. Examples of suitable scattering materials are particle dispersions that include titanium dioxide ($TiO_2$, including anatase and rutile and mixtures thereof), alumina ($Al_2O_3$), silica ($SiO_2$), zirconia ($ZrO_2$), yttria ($Y_2O_3$) and zinc sulfide (ZnS) and mixtures of two or more thereof. These size of such scattering particles may be from 100 nm to 15 µm, typically from 200 nm to 1 µm. The particles may be dispersed in suitable binders, which may be similar to the binders that can be used for the complementary wavelength converting material. Alternatively or additionally, a scattering domain may also comprise scattering pores, such as those commonly present in sintered scattering ceramic layers, e.g. scattering alumina, zirconia, titania, yttria, or zirconia, or it may consist of polycrystalline materials that scatter at grain boundaries, such as densely sintered alumina.

The scattering domain may be highly scattering such as to be substantially reflective. In such a configuration the high reflectivity part of the scattering layer may cover only part of the first wavelength converting material, typically only the side faces. Furthermore, the color adjusting arrangement may comprise scattering domains having various degrees of scatter; for example a highly scattering (reflective) domain at the lateral sides of the first wavelength converting material and a slightly scattering (diffusive) domain at the top surface of the first wavelength converting material. The highly scattering side faces will also reflect incident ambient light to a high extent and hence may increase a color neutral reflectance of the illumination device in the off-state, whereas the generated light in the on-state is not severely blocked and a significant light extraction may thus still be achieved, especially when the side face area is relatively small compared to the top face area. The side reflector may help to eliminate light leakage to the sides of light of the first wavelength range not converted by the first wavelength converting material or light leaking through a bonding layer present between the semiconductor light emitting element and the first wavelength converting material or from the light emitting element side faces. Thus the reflecting side face emission may help to improve color-over-angle uniformity. An embodiment of the invention comprising multiple scattering domains is described in more detail below with reference to FIG. 4.

It shall be noted that a wavelength converting material itself may have scattering properties. In embodiments of the invention, in particular the complementary wavelength converting material may also provide a scattering function, as described above.

Figure 3:
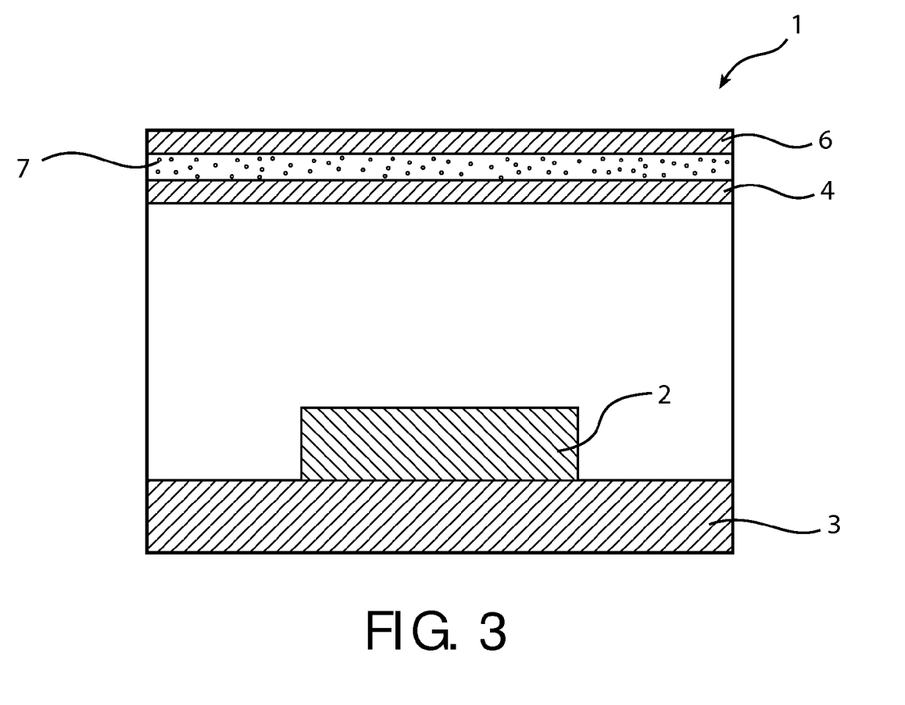
FIG. 3 illustrates an illumination device comprising a color adjusting arrangement according to embodiments of the invention.

An embodiment of the invention based on a remote phosphor arrangement is illustrated in FIG. 3. In this embodiment, the illumination device 1 comprises an LED 2 arranged on a substrate 3 as described above with reference to FIG. 1, and further comprises a first domain 4 comprising the first wavelength converting material arranged at a distance from the LED 2. The wavelength converting material 4 may for example be separated from the LED 2 by an air gap. Thus, this embodiment represents a remote phosphor arrangement. Typically, the distance between the LED and the first wavelength converting material may be from 0.5 mm to 200 mm. The first wavelength converting material 4 may be dispersed in a binder material such as an acrylate binder and coated onto a foil, or spray-coated onto a substrate, such as a curved substrated, e.g. a glass envelope. The foil or substrate comprising a layer of said first wavelength converting material may then be arranged at a distance from the LED. A remote phosphor configuration allows efficient recycling of light by using an inner wall (not shown) of the illumination device and/or a substrate 3 having a reflective surface of high reflectivity.

Furthermore, in the embodiment illustrated in FIG. 3, the complementary wavelength converting material is comprised in a separate domain 6 located on the side of the first domain 4 facing away from the LED.

In another embodiment, the first wavelength converting material may be located close to the LED, e.g. deposited on the LED, and the complementary wavelength converting material may be located at a distance from the LED.

In yet another embodiment of the invention where the scattering layer 7 is transmissive to light of wavelengths which the complementary wavelength converting material is adapted to absorb, the scattering layer may be arranged on top of the complementary domain 6, i.e. in the path of incident ambient light towards the complementary wavelength converting material. For instance, alumina scattering particles do not absorb near UV-light, thus allowing partial near-UV light transmission.

Figure 4:
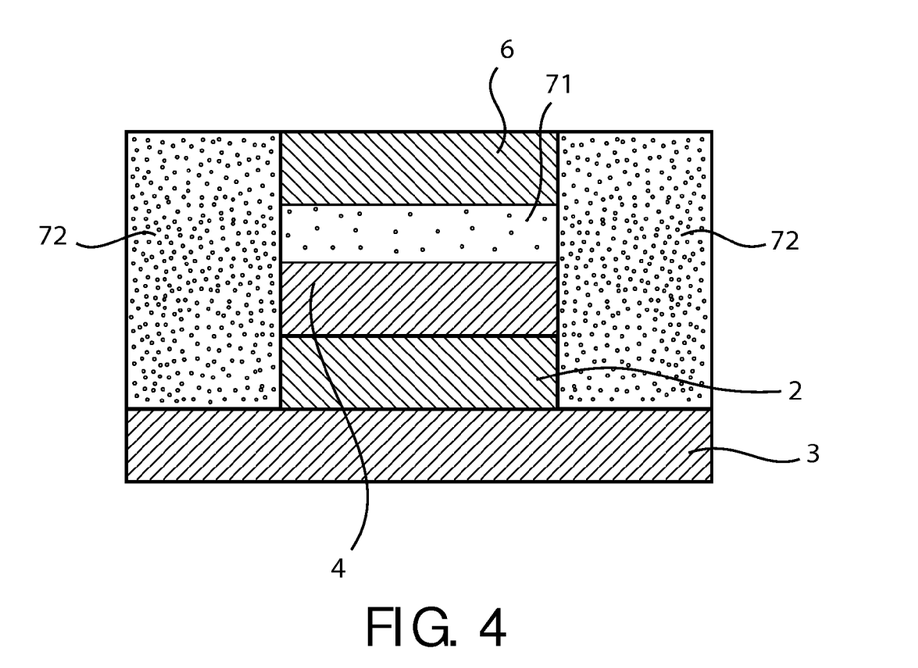
FIG. 4 illustrates an illumination device comprising a color adjusting arrangement according to embodiments of the invention.

In further embodiments of the invention, the color adjusting arrangement may comprise a plurality of scattering domains, e.g. layers, which have different scattering properties. An example of such an embodiment is illustrated in FIG. 4, wherein a scattering layer 71 is provided between a first domain comprising the first wavelength converting material and a complementary domain comprising the complementary wavelength converting material as described above with reference to FIG. 3. The scattering layer 71 may be diffusive. Furthermore, at least one scattering domain 72 is provided on each side of the LED 2. The scattering domain 72 may be one domain at least partially enclosing the LED 2. The scattering domain may be more reflective than the scattering layer 72, e.g. highly reflective. Also, as described above, the scattering layer 71 may be arranged on top of the complementary domain 6, i.e. in the path of incident ambient light towards the complementary wavelength converting material.

Alternatively, the complementary domain 6 may be scattering. For example, the complementary domain 6 may comprise scattering particles as described above in addition to the complementary wavelength converting material, and/or may it comprise scattering structures, such as pores. Thus, the complementary domain 6 may perform the diffusive scattering function and a separate layer 71 may thus be omitted.

Optionally, the complementary domain 6 may be arranged to cover the scattering domain 72.

Since some scattering materials, e.g. titanium dioxide, may absorb UV and/or near UV light, a scattering material, when present, might compete with the complementary wavelength converting material for the UV and/or near UV component of the ambient light, resulting in a reduced emission of the light of the complementary wavelength range. In order to avoid competition for UV and/or near UV light when a UV/near UV absorbing scattering material is used, the complementary wavelength converting material may be arranged in the path of incident ambient light extending towards the scattering material. Thus, the ambient light will reach the complementary wavelength converting material before reaching the scattering material. Accordingly, as illustrated in FIG. 3, a scattering layer 7 may be provided between the layer comprising the first wavelength converting material 4 and a layer comprising the complementary wavelength converting material 6. Optionally, any two of these layers may be separated by a substantially transparent layer, such as a substrate or bonding layer, or by an air gap present between the layers.

An example of a scattering material which does not absorb near UV light is alumina.

In embodiments of the invention, the illumination device may be designed for replacement of conventional light bulbs and may have a bulb-shaped envelope. Typically, in such embodiments, the first wavelength converting material may be arranged at a distance from the LED, for example applied on at least a part of the inside of the envelope (i.e., the side of the envelope facing the LED). The complementary wavelength converting material may then be applied on the opposite side, or outside, of the envelope. The first wavelength converting material and the complementary wavelength converting material may thus be separated by the envelope, typically a glass substrate.

In yet other embodiments, the illumination device may be of spot light type. A collimator may thus be present on the semiconductor light emitting element directing the light to the exit window and collimating this light flux. Typically, in such embodiments, the first wavelength converting material may be arranged at a distance from the LED, for example in a light exit window of the illumination device. The first wavelength converting material may for example be applied on the inside of a transmissive plate or envelope. The complementary wavelength converting material may also be applied on the transmissive plate or envelope, either on the same side as the first wavelength converting material, preferably between the first wavelength converting material and the transmissive plate or envelope, or on the opposite side of the transmissive plate or envelope.

In embodiments of the invention, the illumination device may comprise a dichroic reflector which is capable of reflecting UV light and/or near UV and/or violet/deep blue, such as light of wavelengths shorter than 430 nm, and which is capable of transmitting light of longer wavelengths. The dichroic reflector is thus an interference filter that acts as a long pass filter. The wavelength at which the dichroic filter switches from transmissive to reflective may be tuned and optimized to match the absorption characteristics of the complementary wavelength converting material and the emissive characteristics of the first wavelength converting material/LED combination.

When a dichroic reflector is present, the complementary wavelength converting material is preferably arranged on the outside of the dichroic reflector, i.e. on the side of the dichroic reflector facing away from the LED 2. The complementary wavelength converting material may be arranged directly on the dichroic reflector. Thus, incident ambient UV light not converted during the first passage through the complementary wavelength converting material will be reflected back and thus have another chance of being converted. Thus, the use of a dichroic reflector may increase the amount of light converted by the complementary wavelength converting material. Also, by protecting the first wavelength converting material and, when present, the scattering layer from ambient UV light, a dichroic reflector may avoid or reduce UV induced damage and/or improve the performance of the first wavelength converting material and/or a scattering layer.

In embodiments of the invention, the dichroic layer may also reflect light of at least a part of the complementary wavelength range, in particular when the first wavelength converting material is a full conversion phosphor, i.e. a phosphor which converts substantially all of the incident light of the first wavelength range. An example of such a phosphor is a red-emitting phosphor. By reflecting a component of the ambient light having a wavelength in the complementary wavelength range, the dichroic reflection may contribute to the color adjusting effect of the color adjusting arrangement according to embodiments of the invention. However, in a white emission illumination device comprising a blue LED and a yellow-emitting wavelength converting material, preferably a dichroic reflector may reflect light of wavelengths up to about 430 nm but substantially transmit light of longer wavelengths, in order not to reduce the on-state emission efficiency of the device and on-state color adjusting effect. The dichroic filter function will depend on the incident angle of light, and the wavelength at which the filter switches from reflective to transmissive will thus shift towards lower wavelengths with increasing angle deviation from the normal. This may help to partially suppress excess of blue light near the normal that may be transmitted by the first wavelength converted material in the on-state to a larger extent than blue light transmitted at larger angles due to longer path lengths/absorption lengths at larger angles. Hence, on-state color-over-angle may also be enhanced by a dichroic reflector.

In embodiments of the invention, active illumination may be used for providing light for conversion into the complementary wavelength range by the complementary wavelength converting material. For example, if the component of the ambient light, e.g. UV light, that is to be converted into the complementary wavelength range is scarce, an additional light source may be used for emitting light of that particular wavelength range, e.g. UV light. Thus, active illumination of the complementary wavelength converting material, e.g. with UV light, results in an increased amount of light of the complementary wavelength range. The additional light source may be an additional LED. Typically, the additional light source is turned on when the LED 2 is turned off.

In other embodiments of the invention the illumination device may comprise a lens positioned at a light exit window of the illumination device. The lens may be a flat lens such as a Fresnel lens type. The lens may collect a significant part of the angular light distribution emitted by the device and focus this light in a predefined, narrower angular range so as to further collimate the light. Such a configuration may be desirable in thin flash LED modules, to achieve small flash lights for applications such as camera flash for mobile phones or picture cameras, or for video flash purposes in such applications.

In general, white LED devices using the standard YAG:Ce material emits white light that may be perceived as "cold", i.e. having a relatively high correlated color temperature $T_c$. In embodiments of the invention, in order to achieve warmer white appearance (relative low $T_c$), a dual phosphor system may be used which comprises at least two different wavelength converting materials instead of a single first wavelength converting material. For example as the first wavelength converting material described above, a combination of a YAG:Ce material, e.g. in the form of a ceramic layer, with an additional red-emitting phosphor applied thereon, e.g. as a coating, may be used. In this example, part of the blue light emitted by the LED is then transmitted through the phosphor stack, where part of the light is converted to yellow by the original YAG:Ce phosphor, and part of the light is converted to red by the additional phosphor. The overall emitted light may then have a warmer yellow appearance, e.g. orange like. Thus, the first wavelength converting material may consist of at least two different wavelength converting materials, which may be either stacked as different domains or layers, or mixed in a single domain or layer.

The person skilled in the art realizes that the present invention by no means is limited to the preferred embodiments described above. On the contrary, many modifications and variations are possible within the scope of the appended claims. For example, in the illumination device may comprise a plurality of semiconductor light emitting elements, e.g. a LED array. In such embodiments, the color adjusting arrangement or a part thereof may cover a plurality of semiconductor light emitting elements.

The invention claimed is:

1. A color adjusting arrangement comprising:
    a first wavelength converting material arranged to receive ambient light incident from a viewing position outside the color adjusting arrangement, and capable of converting ambient light of a first wavelength range into light of a second wavelength range, and/or reflecting ambient light of the second wavelength range, the second wavelength range being part of the visible light spectrum; and
    a complementary wavelength converting material arranged to receive ambient light and capable of converting part of the ambient light into light of a complementary wavelength range, which is complementary to the second wavelength range, and arranged to allow mixing of light of the second wavelength range and the complementary wavelength range, and
    a dichroic reflector,
    wherein:
    the light of the second wavelength range that is emitted and/or reflected by the first wavelength converting material is mixed with light of the complementary wavelength range when leaving the color adjusting arrangement towards the viewing position, the light leaving the color adjusting arrangement having a color point substantially near the black body line, and
    the dichroic reflector reflects part of the ambient light that is not converted into the light of the complementary range back into the complementary wavelength converting material, and transmits the light of the second wavelength range toward the viewing position.

2. A color adjusting arrangement according to claim 1, wherein the complementary wavelength converting material is capable of converting ambient light in the wavelength range between 250 and 420 nm into light of the complementary wavelength range of between 400 and 500 nm.

3. A color adjusting arrangement according to claim 1, comprising a first domain comprising the first wavelength converting material, and a complementary domain comprising the complementary wavelength converting material.

4. A color adjusting arrangement according to claim 3, wherein the complementary domain additionally comprises scattering elements.

5. A color adjusting arrangement according to claim 3, wherein a scattering domain is arranged in the path of incident ambient light extending via the complementary domain to the first domain, such that incident ambient light first reaches the complementary domain, subsequently reaches the scattering domain, and reaches the first domain.

6. A color adjusting arrangement according to claim 3, comprising a plurality of scattering domains having different scattering properties.

7. A color adjusting arrangement according to claim 3, wherein the dichroic reflector is arranged in the path of incident ambient light extending via the complementary domain to the first domain, such that incident ambient light first reaches the complementary domain, and subsequently reaches the dichroic reflector.

8. A color adjusting arrangement according to claim 1, wherein the complementary wavelength converting material comprises a BAM phosphor.

9. A color adjusting arrangement according to claim 1, wherein the complementary wavelength converting material comprises an organic material.

10. A color adjusting arrangement according to claim 1, wherein the first wavelength range is from 420 to 480 nm, the second wavelength range is from 490 to 780 nm.

11. An illumination device, comprising at least one semiconductor light emitting element for emitting light of the first wavelength range and a color adjusting arrangement according to claim 1.

12. An illumination device according to claim 11, wherein the first wavelength converting material is arranged in a path of light from the semiconductor light emitting element) towards the complementary wavelength converting material, such that, in the on-state of the illumination device, light emitted by the semiconductor light emitting element reaches the first wavelength converting material before reaching the complementary wavelength converting material.

13. An illumination device according to claim 11, wherein the semiconductor light emitting element and at least one of the first wavelength converting material and the complementary wavelength converting material are arranged mutually spaced apart.

14. An illumination device according to claim 1, wherein the illumination device in its on-state emits light having a color point substantially near the black body line.

15. An illumination device according to claim 11, further comprising an additional light source emitting light of the first wavelength range to the complementary wavelength converting material for conversion into light of the complementary wavelength range.

16. The illumination device of claim 15, wherein the first wavelength range is from 250 to 420 nm.

17. The color adjusting arrangement of claim 10, wherein the dichroic reflector transmits light above 430 nm.

18. The color adjusting arrangement of claim 1, wherein the dichroic reflector transmits light above 430 nm.

19. The color adjusting arrangement of claim 1, wherein the dichroic reflector reflects ultraviolet light.

20. The color adjusting arrangement of claim 1, wherein the dichroic reflector reflects at least a portion of the ambient light in the complementary wavelength range.

* * * * *